US011877380B2

(12) United States Patent
Gagnon et al.

(10) Patent No.: US 11,877,380 B2
(45) Date of Patent: Jan. 16, 2024

(54) CABLE MANAGEMENT SYSTEM

(71) Applicant: WANHO Manufacturing, LLC., Cheshire, CT (US)

(72) Inventors: Arthur C. Gagnon, Terryville, CT (US); David Robert Elliott, Cheshire, CT (US); Manoj Kurubur Venkateshappa, Waterbury, CT (US)

(73) Assignee: WANHO MANUFACTURING, LLC., Cheshire, CT (US)

( * ) Notice: Subject to any disclaimer, the term of this patent is extended or adjusted under 35 U.S.C. 154(b) by 224 days.

(21) Appl. No.: 17/576,266

(22) Filed: Jan. 14, 2022

(65) Prior Publication Data
US 2023/0232565 A1 Jul. 20, 2023

(51) Int. Cl.
*B64C 1/00* (2006.01)
*H05K 7/18* (2006.01)

(52) U.S. Cl.
CPC .................................. *H05K 7/186* (2013.01)

(58) Field of Classification Search
CPC ........... H05K 7/186; H02G 3/263; H02G 3/30
See application file for complete search history.

(56) References Cited

U.S. PATENT DOCUMENTS

| | | | |
|---|---|---|---|
| 8,770,520 B2* | 7/2014 | Robrecht | H02G 3/30 244/119 |
| 10,460,589 B1* | 10/2019 | Srinivasan | H05K 7/1497 |
| 2012/0025024 A1* | 2/2012 | Robrecht | H02G 3/30 244/131 |
| 2017/0280580 A1* | 9/2017 | Nguyen | H05K 7/186 |
| 2020/0119537 A1* | 4/2020 | Heath | H02G 7/20 |
| 2020/0244054 A1 | 7/2020 | Brandvold | |
| 2021/0195784 A1 | 6/2021 | Chen et al. | |
| 2022/0123538 A1* | 4/2022 | Anderson | H02G 3/263 |
| 2022/0282804 A1* | 9/2022 | Davis | F16B 5/0628 |

* cited by examiner

*Primary Examiner* — Amy J. Sterling
(74) *Attorney, Agent, or Firm* — Browdy and Neimark, PLLC (57) ABSTRACT

A cable management system includes a mounting bracket having a backing plate, two face mounts, and a panel, said face mounts each include an orifice and an aperture of different inner diameter, said panel includes a number of openings and a number of holes of different inner diameter, a extender bracket includes two walls and two end pieces secured together, said walls and said end pieces each include an eyelet and a piercing of different inner diameter, a fastening member includes a backing plate insert for engaging with said orifice of said face mounts and said eyelet of said walls and said end pieces of said extender brackets, a screw hole formed in said fastening member and formed through said backing plate insert, and an inner thread formed in said fastening member and spaced from said screw hole and said backing plate insert for engaging with bolts.

9 Claims, 9 Drawing Sheets

CABLE MANAGEMENT SYSTEM

BACKGROUND OF THE INVENTION

1. Field of the Invention

The present invention relates to a cable management system, and more particularly to a cable management system including an improved and simplified structure or configuration for solidly and stably carrying or supporting a cable in place and for preventing the cable from hanging down and for effectively eliminating the vibration and for preventing the signal interference or passive intermodulation (PIM) from being happened or occurred and for improving the signal transmission quality.

2. Description of the Prior Art

Telecom industry is ever changing with new technologies and inventions. As the industry deploys advanced technologies like LTE and 5G cable requirements change with it. Fiber cables no longer stop at the base of the telephone tower. Cable management adds a lot of cost to new or upgrading projects. When telecom mounting brackets plan to expand or deploy new technology, they would like to have flexibility to do so without having to worry about cable management costs.

PIM losses were not so significant in 2G or 3G networks but with 5G PIM loss adds up which in turn results in poor quality signals. PIM can no longer be ignored due to these huge losses so more and more service providers are trying to find alternatives to traditional equipment and accessories which would mitigate PIM.

Our Universal PIM Bracket series makes cable management hassle free and gives control to the installer to decide the best configuration for a given setup with very few restrictions. Each individual component of the bracket comes with various number of ⅜" and ¾" holes that could be used for snap-in and threaded rod application. Universal hole pattern allows the bracket kit to be configured according to the cable management needs.

Brackets are designed to combat Passive Intermodulation. Brackets have rounder corners since sharp edges can contribute to PIM. Brackets have a 90-degree bends with gussets to eliminate vibration which is another source of PIM. Brackets are made with galvanized steel and are paired with galvanized hardware to make sure there is no dissimilar metal contact which is another major contributing factor to PIM.

Pipe Mount Bracket can be secured to round members using a U-bolt assembly making it a quick and easy installation. Bracket can accommodate various U-bolt sizes and can be mounted on pipe diameters of 2⅜", 2⅞" or 3½". ¼" thick mounting plate on the pipe mount bracket makes the bracket strong and avoids twisting under load. Rest of the bracket is made up of ⅛" thick material to ensure all standard snap-ins work without any issues.

Main feature of the Universal PIM Bracket is its flexibility and versatility to be modified in numerous configurations without having to change installation method. It can work with various antenna and radio mount configurations and make cable management as easy as possible. It gives installer enough mounting options to be able to do cable management as neat and simple as possible. If there is a need for more mounting options installers can buy additional individual bracket components and build a new configuration to accommodate additional cable.

Typical cable management systems or systems comprise one or more beams or extender brackets secured or connected together to carry or support a cable in place and to prevent the cable from hanging down.

For example, U.S. patent publication No. 2020/0244054 A1 to Brandvold, and U.S. patent publication No. 2021/0195784 A1 to Chen et al. disclose several of the typical cable management systems or systems each comprising one or more beams or extender brackets secured or connected together to carry or support a cable in place and to prevent the cable from hanging down.

However, the beams or extender brackets may not be solidly and stably secured or connected together and may become loose relative to each other and may have vibrations occurred between the beams or extender brackets, such that signal interference or passive intermodulation (PIM) problems may have a good chance to be happened or occurred while carrying or supporting the cable on the typical cable management systems or systems.

The present invention has arisen to mitigate and/or obviate the afore-described disadvantages of the conventional cable management systems or systems.

SUMMARY OF THE INVENTION

The primary objective of the present invention is to provide a cable management system including an improved and simplified structure or configuration for solidly and stably carrying or supporting a cable in place and for preventing the cable from hanging down and for effectively eliminating the vibration and for preventing the signal interference or passive intermodulation (PIM) from being happened or occurred and for improving the signal transmission quality.

In accordance with one aspect of the invention, there is provided a cable management system comprising a supporting member, a mounting bracket attached to the supporting member, the mounting bracket including a backing plate, an face mount, and a panel, the face mount including an orifice and an aperture formed in the face mount, the orifice including an inner diameter greater than that of the aperture of the face mount, a first extender bracket including two walls and two end pieces secured together, the walls and the end pieces each including a first eyelet and a first piercing, the first eyelet including an inner diameter greater than that of the first piercing of the walls and the end pieces of the first extender bracket, a first fastening member including a backing plate insert for engaging with the orifice of the face mount and either of the first eyelets of the walls and the end pieces of the first extender bracket, a screw hole formed in the first fastening member and formed through the backing plate insert, and an inner thread formed in the first fastening member and spaced from the screw hole and the backing plate insert, and two bolts engaged with the inner thread and the screw hole and the backing plate insert of the first fastening member for securing the mounting bracket and the first extender bracket together for carrying or supporting a cable in place and for preventing the cable from hanging down and for eliminating the vibration and for preventing the signal interference or passive intermodulation (PIM) from being happened or occurred and for improving the signal transmission quality.

The walls of the first extender bracket each include at least one second eyelet and at least one second piercing formed in the walls of the first extender bracket. The panel includes a plurality of openings and a plurality of holes formed in the panel, the openings include an inner diameter greater than that of the holes of the panel for engaging with the backing plate insert of the first fastening member.

A second fastening member may further be provided and includes a backing plate insert for engaging with either of the openings of the panel and either of the third eyelets of the walls and the end pieces of the second extender bracket, a screw hole formed in the second fastening member and formed through the backing plate insert of the second fastening member, and an inner thread formed in the second fastening member and spaced from the screw hole and the backing plate insert of the second fastening member, and two bolts engaged with the inner thread and the screw hole and the backing plate insert of the second fastening member for securing the mounting bracket and the second extender bracket together.

The mounting bracket includes a rounded corner structure formed between the panel and the face mount of the mounting bracket. The mounting bracket includes a gusset formed on the rounded corner structure. The first extender bracket includes a rounded corner structure formed between either of the walls and either of the end pieces of first extender bracket. The first extender bracket includes a gusset formed on the rounded corner structure of first extender bracket.

A third extender bracket may further be provided and includes two walls and two end pieces secured together, the walls and the end pieces of the third extender bracket each include a third eyelet and a third piercing formed in the third extender bracket, the third eyelet of the third extender bracket includes an inner diameter greater than that of the third piercing of the walls and the end pieces of the third extender bracket, a third fastening member includes a backing plate insert for engaging with the orifice of the face mount and either of the third eyelets of the walls and the end pieces of the third extender bracket, a screw hole formed in the third fastening member and formed through the backing plate insert of the third fastening member, and an inner thread formed in the third fastening member and spaced from the screw hole and the backing plate insert of the third fastening member, and two bolts engaged with the inner thread and the screw hole and the backing plate insert of the third fastening member for securing the mounting bracket and the third extender bracket together.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Referring to the drawings, and initially to FIGS. 1-12, a cable management system 1 in accordance with the present invention comprises a base or mounting bracket 10 including a square or rectangular shape or structure or configuration having a backing plate 11, two face mounts 12, 13, and a panel 14, in which the backing plate 11 includes one or more (such as two) oblong holes or horizontal slots 15 formed therein for receiving or engaging with a fastener or U-bolt 16, such as a C or U shaped fastener or U-bolt 16 which includes two legs 161 to engage with the oblong holes or horizontal slots 15 of the backing plate 11 and which may secure or couple the backing plate 11 of the mounting bracket 10 to the supporting member 8, such as a supporting column or round member or pipe 8, with such as with nuts 17 or catches or latches or the like. The face mounts 12, 13 of the mounting bracket 10 each include an orifice 18 and an aperture 19 formed therein, in which the orifice 18 includes an inner diameter greater than that of the aperture 19 of the face mounts 12, 13 of the mounting bracket 10. The panel 14 of the mounting bracket 10 includes a number of openings 20 and holes 21 formed therein, in which the openings 20 include an inner diameter greater than that of the holes 21 of the panel 14 of the mounting bracket 10 and arranged in a stagger way relative to the holes 21 of the panel 14 of the mounting bracket 10.

It is preferable that the mounting bracket 10 includes a rounded corner structure 22 formed or provided between the panel 14 and the face mounts 12, 13 of the mounting bracket 10 respectively, and includes one or more cuts or gussets 23 formed or provided on the rounded corner structure 22 for eliminating the vibration and for preventing the signal interference or passive intermodulation (PIM) from being happened or occurred.

The cable management system 1 further includes one or more, such as a first and at least one second beams or arms or frames or extender brackets 30 each having two longer walls 31, 32 that are parallel to each other, and two shorter end pieces 33, 34 that are parallel to each other and perpendicular to the walls 31, 32 in order to form a square or rectangular shape or structure or configuration, and the extender brackets 30 each include a rounded corner structure 35 formed or provided between the walls 31, 32 and the end pieces 33, 34 respectively, and includes one or more cuts or gussets 36 formed or provided on the rounded corner structure 35 for eliminating the vibration and for preventing the signal interference or passive intermodulation (PIM) from being happened or occurred, and includes a number of eyelets 37 and piercings 38 formed in the walls 31, 32 and the end pieces 33, 34, in which the eyelets 37 include an inner diameter greater than that of the piercings 38 of the walls 31, 32 and the end pieces 33, 34 of the extender brackets 30 for aligning with the orifices 18 and the apertures 19 of the face mounts 12, 13 of the mounting bracket 10 and/or the openings 20 and the holes 21 of the panel 14 of the mounting bracket 10 respectively. The eyelets 37 and the piercings 38 in the walls 31, 32 are arranged in a stagger way relative to each other.

The cable management system 1 further includes one or more, such as a first and at least one second fastening members 50 for securing or coupling to the mounting bracket 10 and the extender brackets 30 together, for example, the fastening members 50 each include a protrusion or backing plate insert 51 extended therefrom (FIG. 3) for engaging with or into the orifice 18 of the face mounts 12, 13 of the mounting bracket 10 and also for engaging with or into the eyelet 37 of the walls 31, 32 (FIGS. 4-5 and 11-12), and/or of the end pieces 33, 34 of the extender brackets 30 (FIGS. 6-7, 9, and 11), or for engaging with or into the orifice 18 of the panel 14 of the mounting bracket 10 and also for engaging with or into the eyelet 37 of the walls 31, 32, and/or of the end pieces 33, 34 of the extender brackets 30 (FIGS. 6, 8-10, and 12). The backing plate 11 of the mounting bracket 10 may also include a number of openings 24 and holes 25 formed therein (FIGS. 4-8) for receiving or engaging with the backing plate insert 51 of the fastening member 50 and for securing or coupling or anchoring or retaining or positioning the mounting bracket 10 and the extender brackets 30 together.

Figure 1:
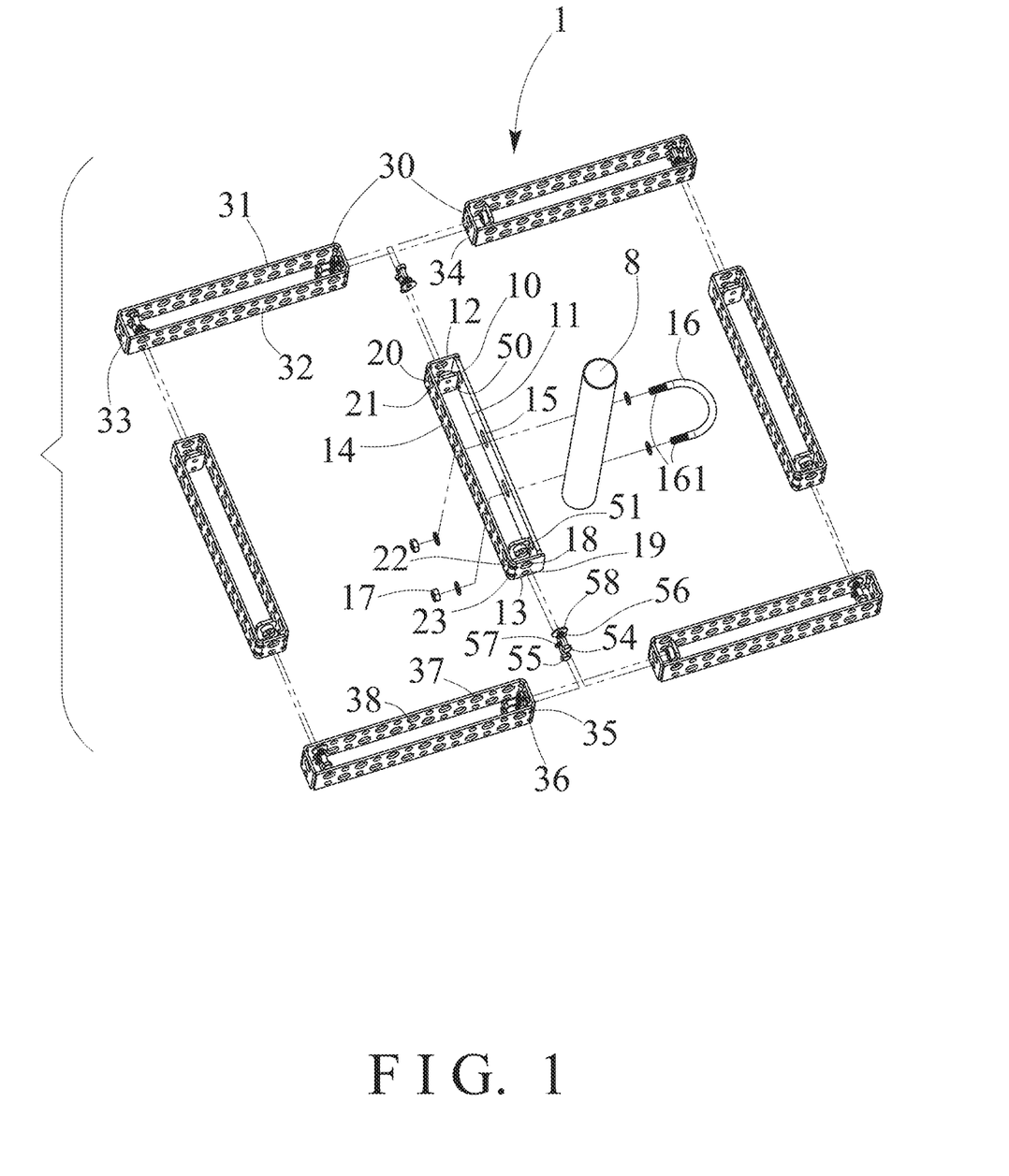
FIG. 1 is a partial exploded view of a cable management system in accordance with the present invention.
Figure 2:
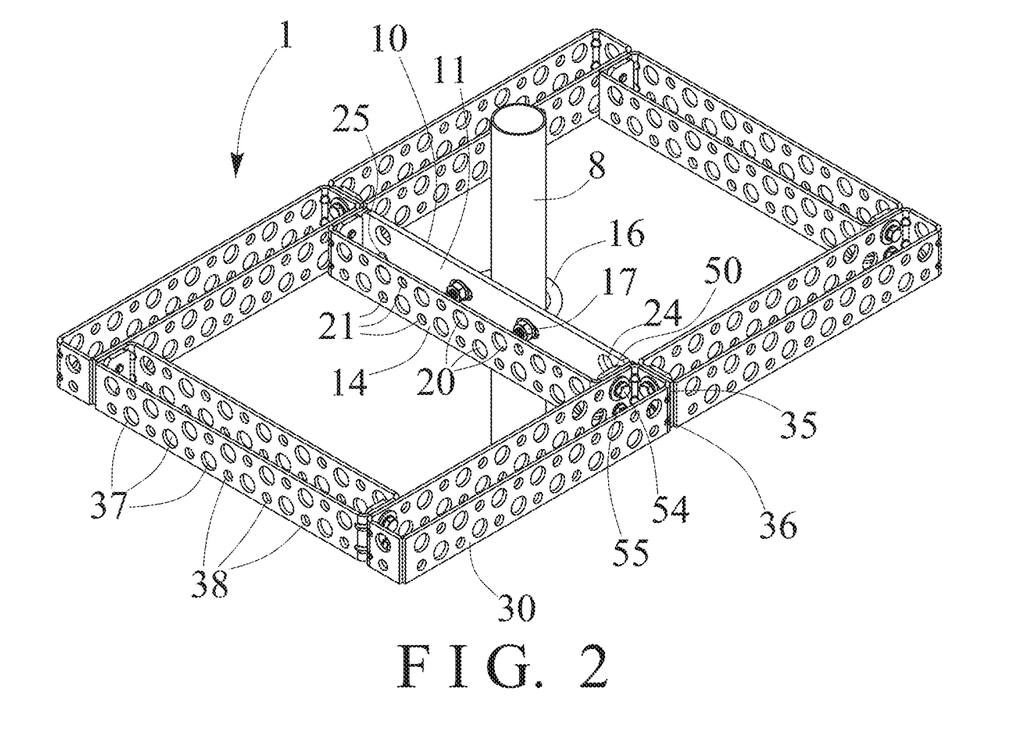
FIG. 2 is a perspective view of the cable management system.
Figure 3:
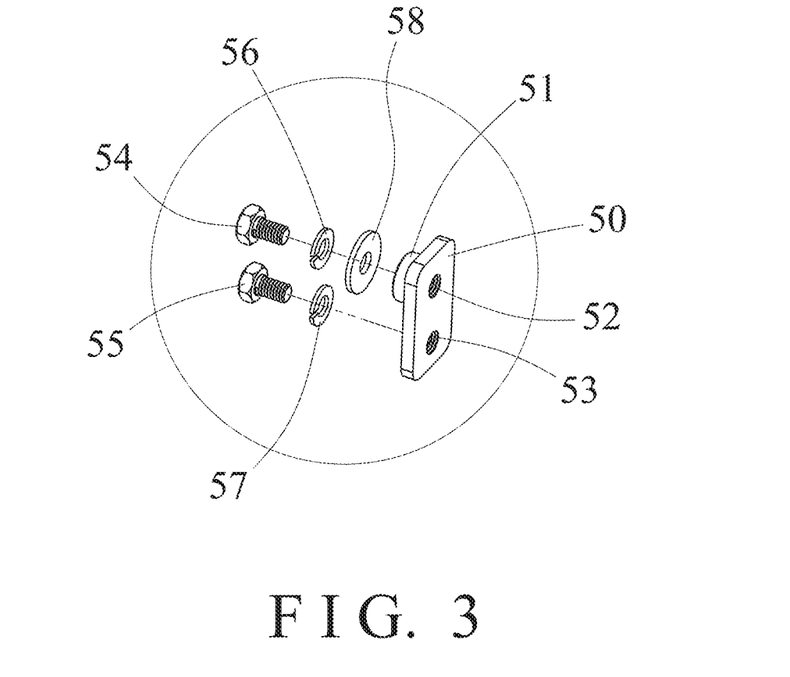
FIG. 3 is an enlarged partial exploded view of the cable management system.
Figure 4:
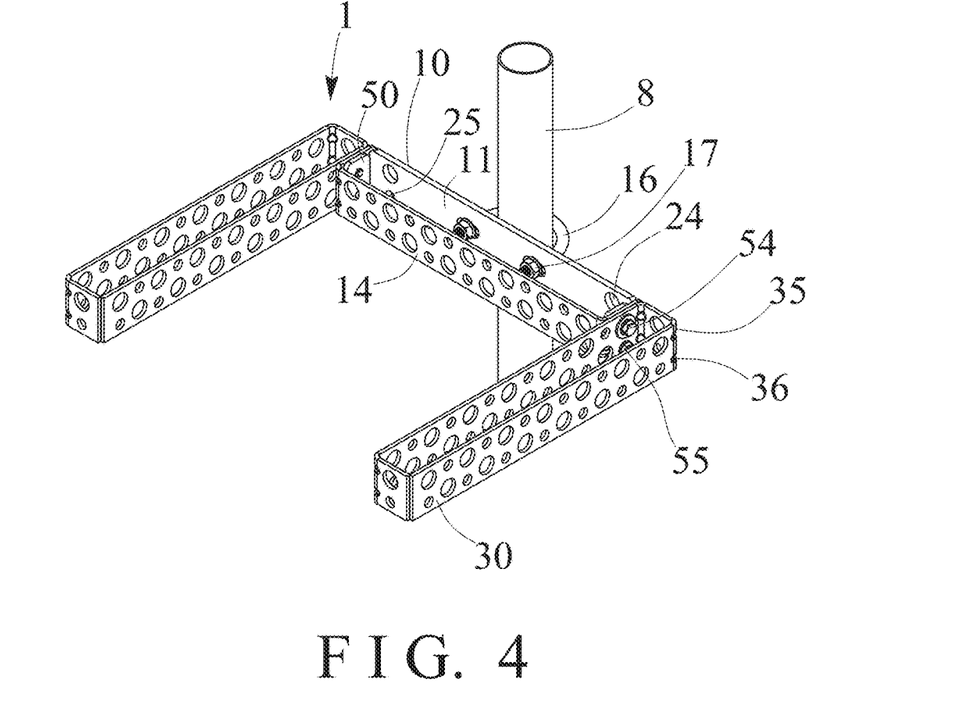
FIGS. 4, 5, 6, 7, 8, 9, 10, 11, 12 are perspective views similar to FIG. 2, illustrating the other arrangement of the cable management system.
Figure 5:
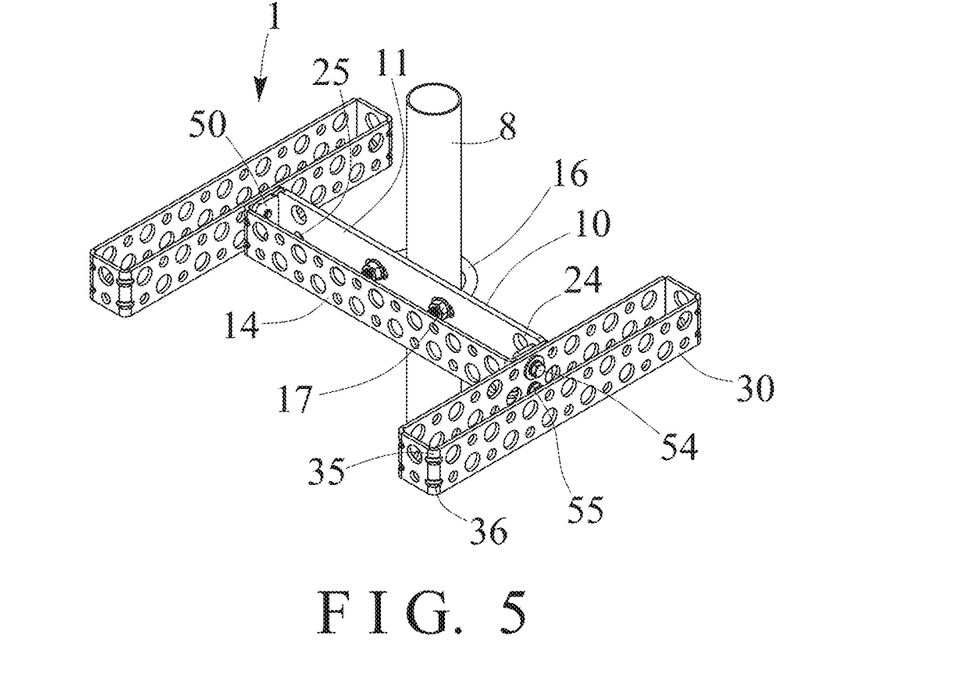
Figure 6:
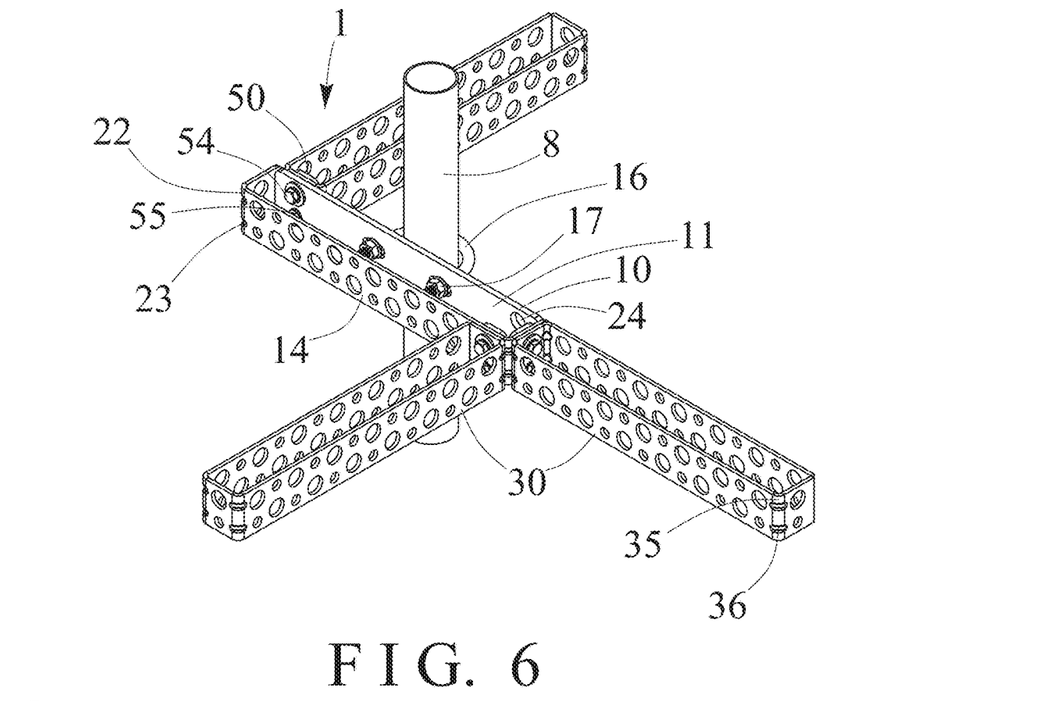
Figure 7:
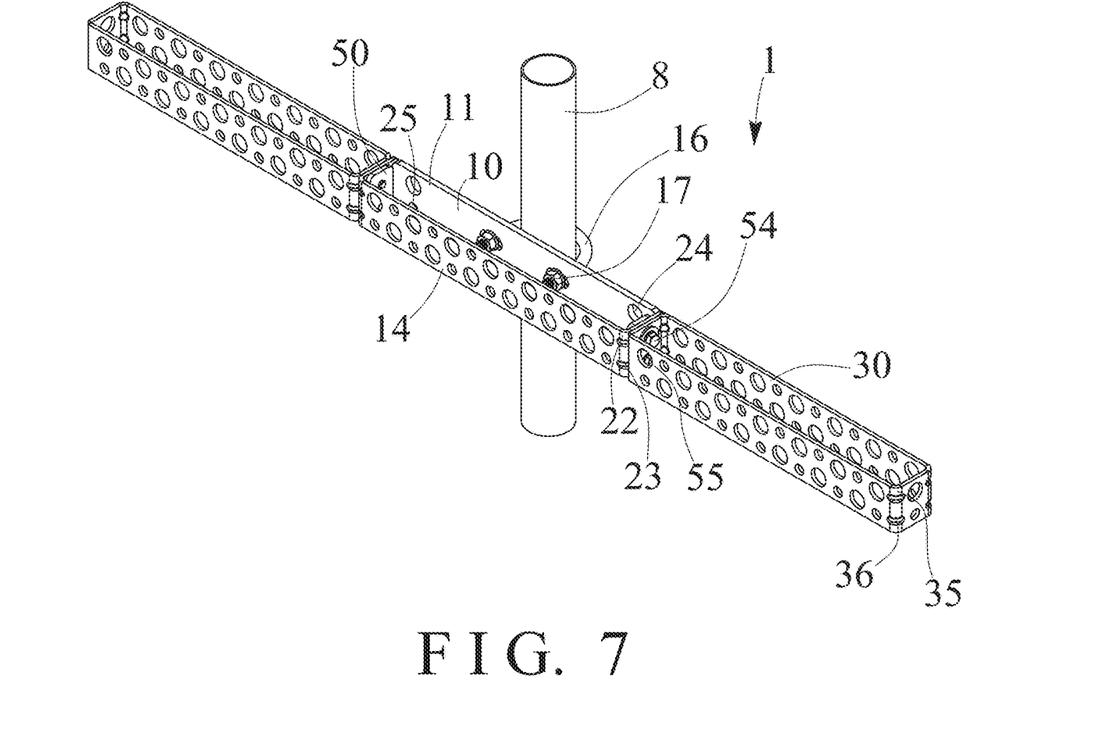
Figure 8:
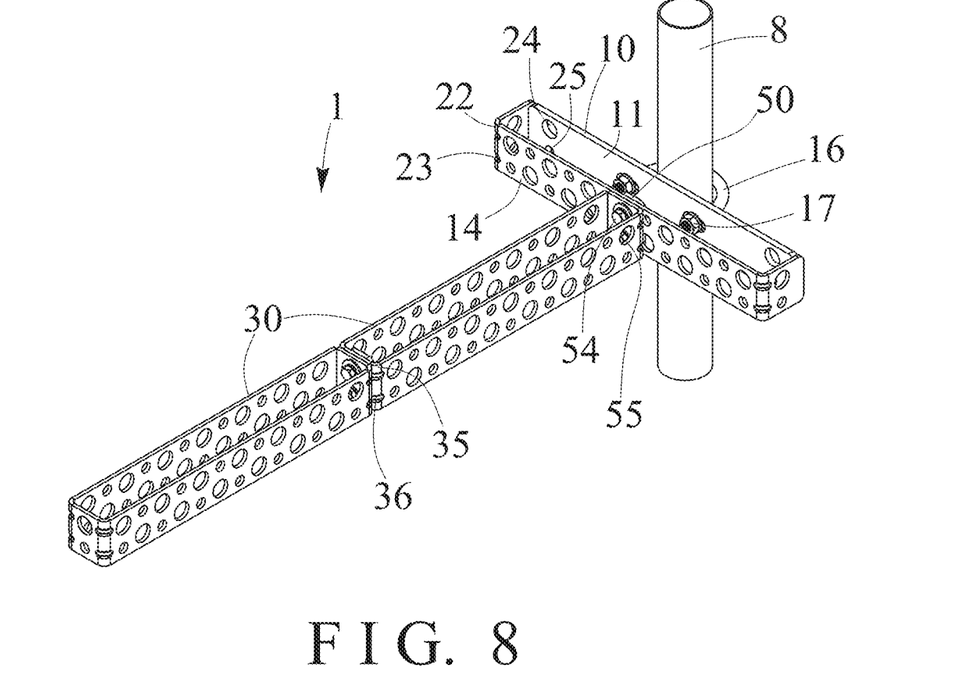
Figure 9:
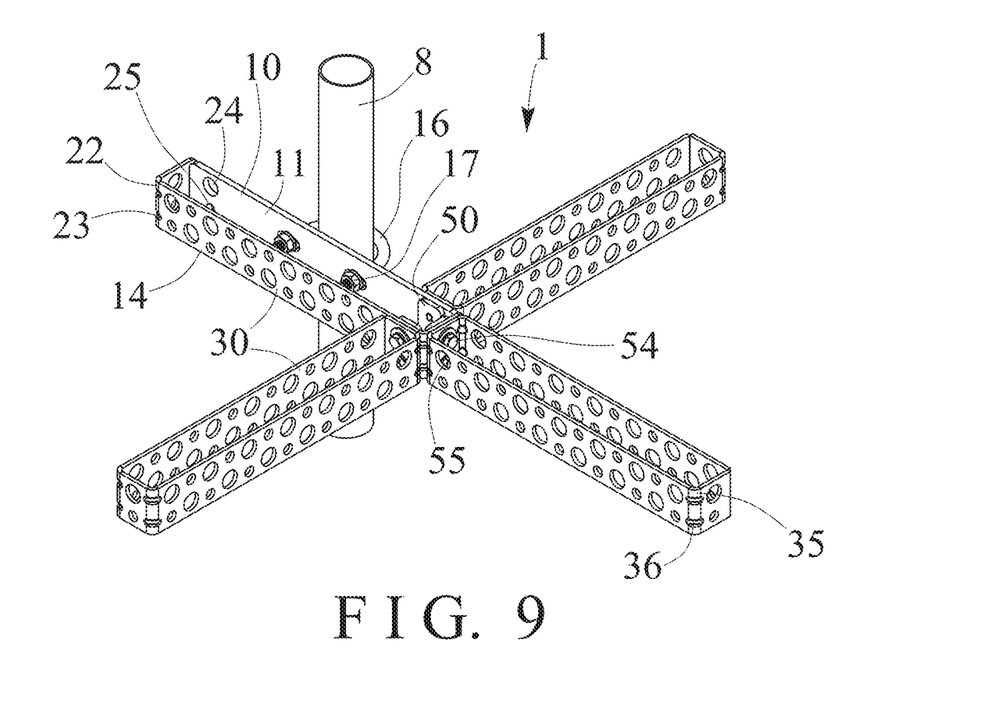
Figure 10:
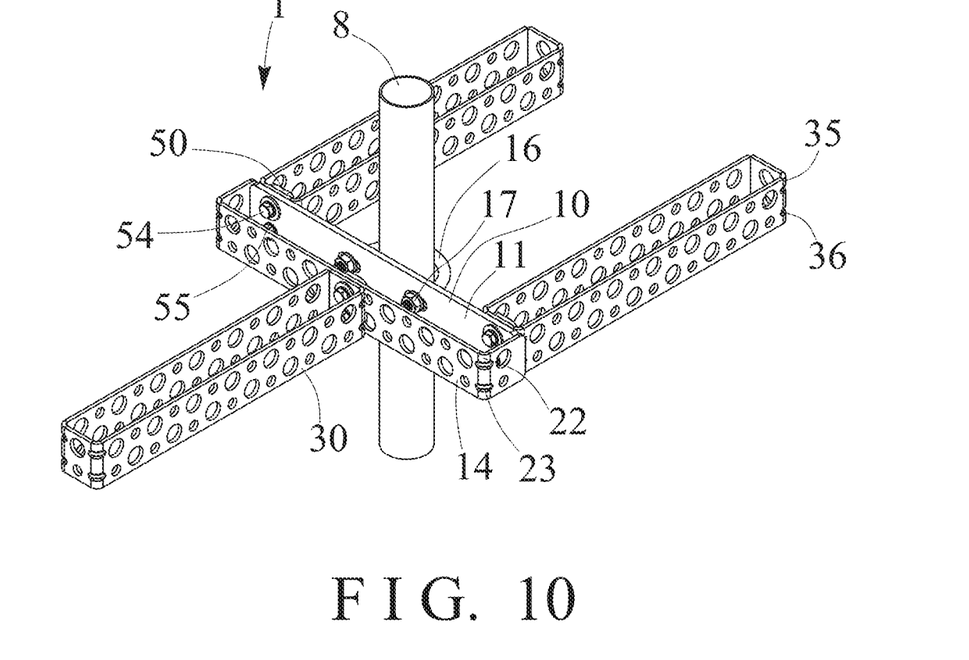
Figure 11:
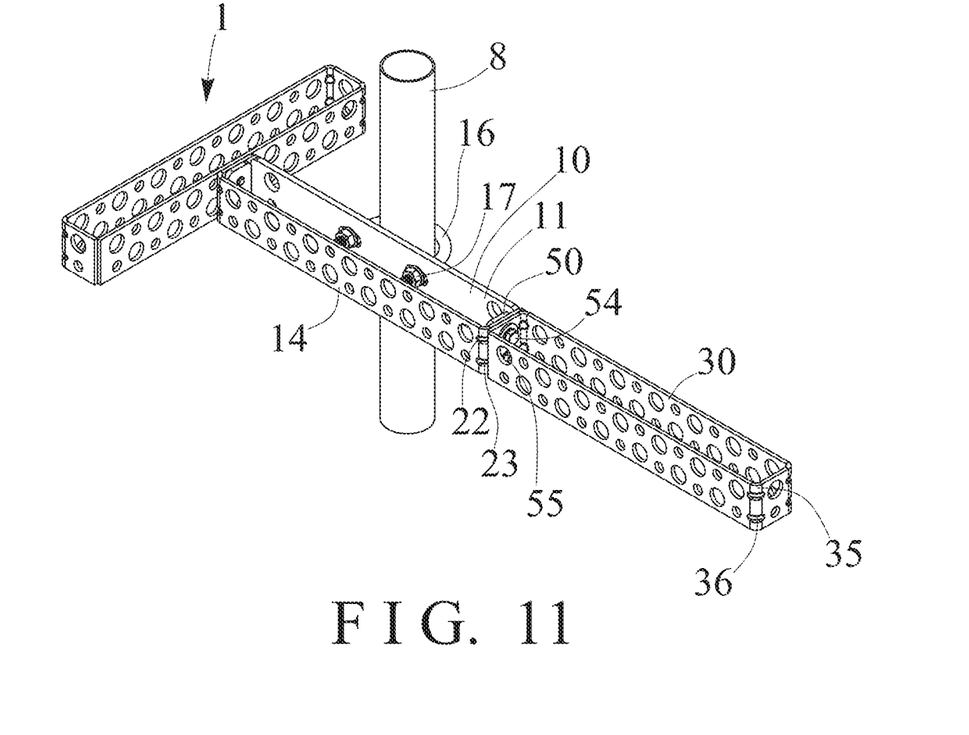
Figure 12:
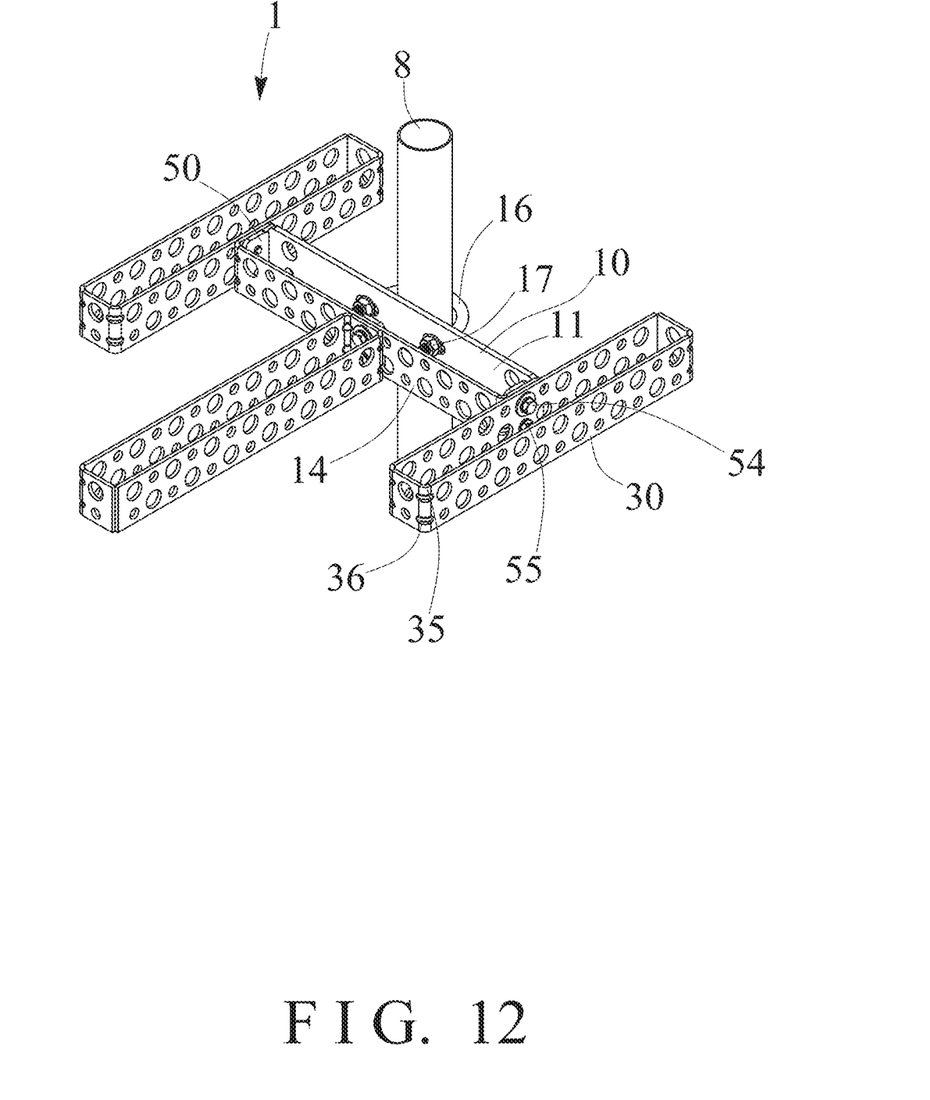

As shown in FIG. 3, the fastening members 50 each include a screw hole 52 formed therein and also formed through the backing plate insert 51, and another screw hole or inner thread 53 formed therein and offset or spaced or separated from the screw hole 52 and the backing plate insert 51 for engaging with screws or bolts 54, 55 or catches or latches or fasteners or the like and/or the spring lock washers 56, 57 and the flat washers 58 for solidly and stably securing or coupling or anchoring or retaining or positioning the mounting bracket 10 and the extender brackets 30 together. It is preferable that the mounting bracket 10 and the extender brackets 30 are made of galvanized steel or the like, and will not be contacted with the other metallic materials.

It is to be noted that the formation or the provision of the rounded corner structure 22 and/or the gussets 23 in the mounting bracket 10, and/or the rounded corner structure 35 and/or the gussets 36 in the extender brackets 30 may be used or provided for eliminating the vibration and for preventing the signal interference or passive intermodulation (PIM) from being happened or occurred. The formation or the provision of the backing plate insert 51 on the fastening member 50 may be used for engaging with or into the orifice 18 of the face mounts 12, 13 and/or the panel 14 of the mounting bracket 10 and the eyelet 37 of the walls 31, 32, and/or of the end pieces 33, 34 of the extender brackets 30 may solidly and stably secure or couple or anchor or retain or position the mounting bracket 10 and the extender brackets 30 together.

Figure 13:
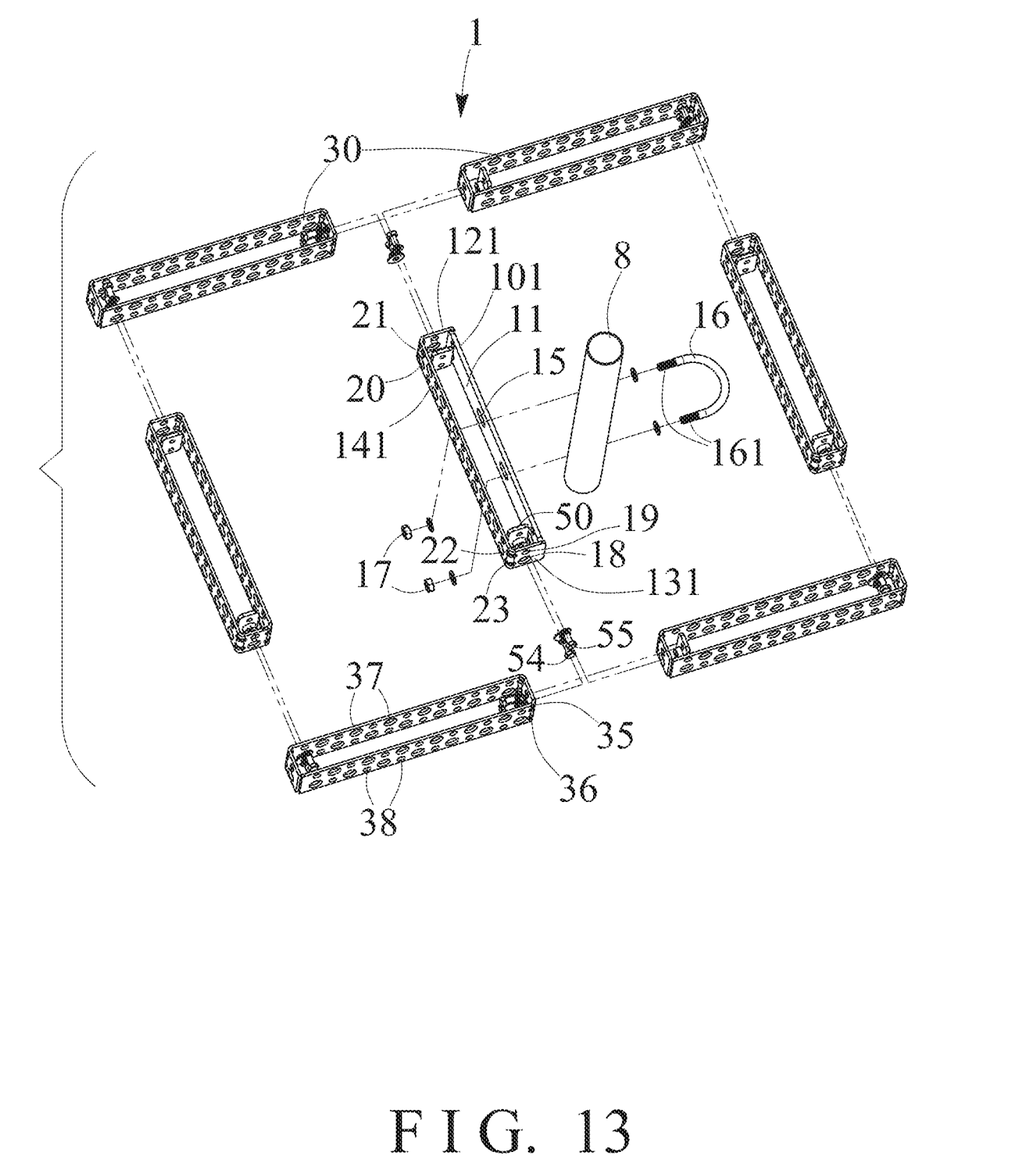
FIG. 13 is another partial exploded view similar to FIG. 1, illustrating the further arrangement of the cable management system.
Figure 14:
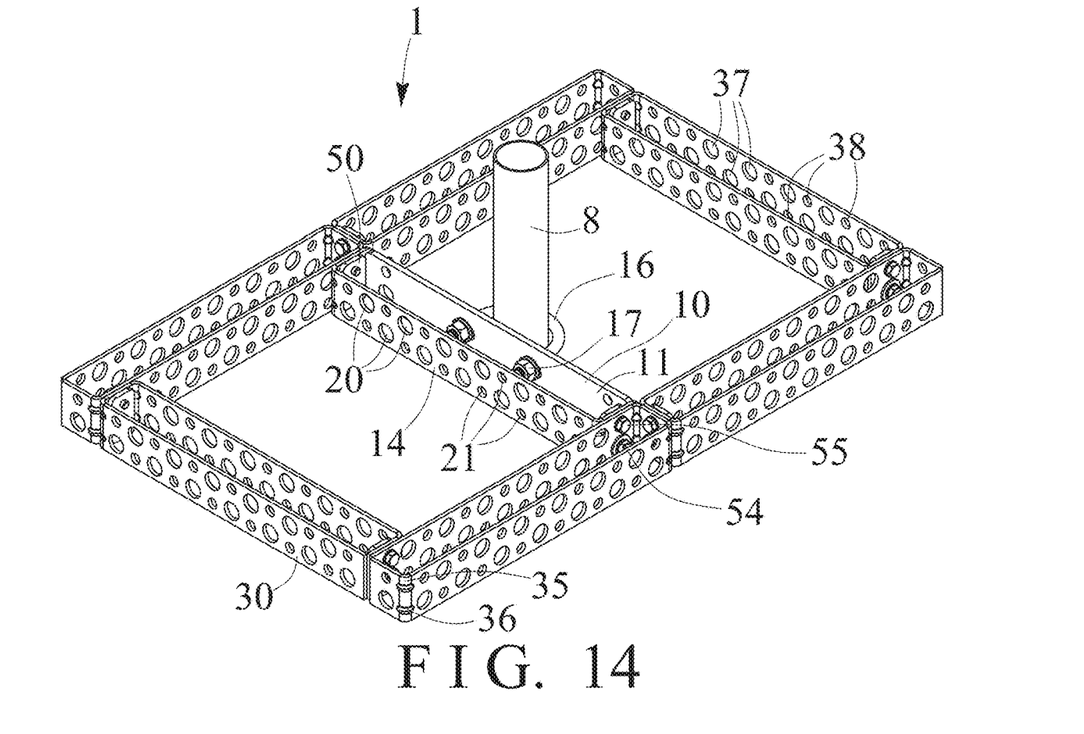
FIG. 14 is a perspective view of the cable management system as shown in FIG. 13.
Figure 15:
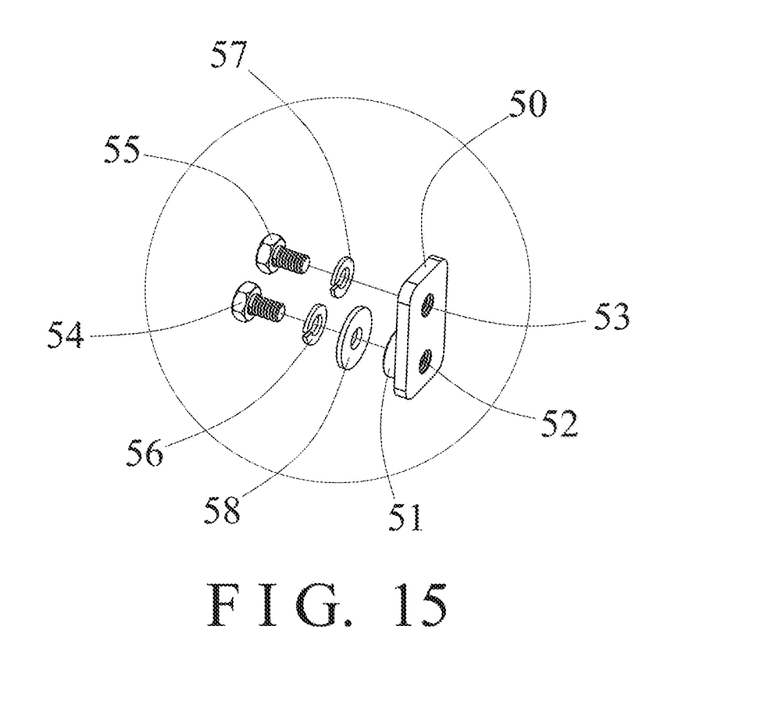
FIG. 15 is an enlarged partial exploded view of the cable management system as shown in FIGS. 13 and 14.

As shown in FIGS. 13-15, the fastening members 50 may be disposed or arranged up side down relative to that shown in FIGS. 1-12 for solidly and stably securing or coupling or anchoring or retaining or positioning the mounting bracket 10 and the extender brackets 30 together.

Accordingly, the cable management system in accordance with the present invention includes an improved and simplified structure or configuration for solidly and stably carrying or supporting a cable in place and for preventing the cable from hanging down and for effectively eliminating the vibration and for preventing the signal interference or passive intermodulation (PIM) from being happened or occurred and for improving the signal transmission quality.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

We claim:

1. A cable management system comprising:
   a supporting member,
   a mounting bracket attached to said supporting member, said mounting bracket including a backing plate, an face mount, and a panel, said face mount including an orifice and an aperture formed in said face mount, said orifice including an inner diameter greater than that of said aperture of said face mount,
   a first extender bracket including two walls and two end pieces secured together, said walls and said end pieces each including a first eyelet and a first piercing, said first eyelet including an inner diameter greater than that of said first piercing of said walls and said end pieces of said first extender bracket,
   a first fastening member including a backing plate insert for engaging with said orifice of said face mount and either of said first eyelets of said walls and said end pieces of said first extender bracket, a screw hole formed in said first fastening member and formed through said backing plate insert, and an inner thread formed in said first fastening member and spaced from said screw hole and said backing plate insert, and
   two bolts engaged with said inner thread and said screw hole and said backing plate insert of said first fastening member for securing said mounting bracket and said first extender bracket together.

2. The cable management system as claimed in claim 1, wherein said walls of said first extender bracket each include at least one second eyelet and at least one second piercing formed in said walls of said first extender bracket.

3. The cable management system as claimed in claim 1, wherein said panel includes a plurality of openings and a plurality of holes formed in said panel, said openings include an inner diameter greater than that of said holes of said panel for engaging with said backing plate insert of said first fastening member.

4. The cable management system as claimed in claim 3 further comprising a second extender bracket including two walls and two end pieces secured together, said walls and said end pieces of said second extender bracket each including a second eyelet and a second piercing, said second eyelet including an inner diameter greater than that of said second piercing of said walls and said end pieces of said second extender bracket, a second fastening member including a backing plate insert for engaging with either of said openings of said panel and either of said second eyelets of said walls and said end pieces of said second extender bracket, a screw hole formed in said second fastening member and formed through said backing plate insert of said second fastening member, and an inner thread formed in said second fastening member and spaced from said screw hole and said backing plate insert of said second fastening member, and two bolts engaged with said inner thread and said screw hole and said backing plate insert of said second fastening member for securing said mounting bracket and said second extender bracket together.

5. The cable management system as claimed in claim 1, wherein said mounting bracket includes a rounded corner structure formed between said panel and said face mount of said mounting bracket.

6. The cable management system as claimed in claim 5, wherein said mounting bracket includes a gusset formed on said rounded corner structure.

7. The cable management system as claimed in claim 1, wherein said first extender bracket includes a rounded corner structure formed between either of said walls and either of said end pieces of first extender bracket.

8. The cable management system as claimed in claim 7, wherein said first extender bracket includes a gusset formed on said rounded corner structure of first extender bracket.

9. The cable management system as claimed in claim 1 further comprising a third extender bracket, said third extender bracket including two walls and two end pieces secured together, said walls and said end pieces of said third extender bracket each including a third eyelet and a third piercing formed in said third extender bracket, said third eyelet of said third extender bracket including an inner diameter greater than that of said third piercing of said walls and said end pieces of said third extender bracket, a third fastening member including a backing plate insert for engaging with said orifice of said face mount and either of said third eyelets of said walls and said end pieces of said third extender bracket, a screw hole formed in said third fastening member and formed through said backing plate insert of said third fastening member, and an inner thread formed in said third fastening member and spaced from said screw hole and said backing plate insert of said third fastening member, and two bolts engaged with said inner thread and said screw bole and said backing plate insert of said third fastening member for securing said mounting bracket and said third extender bracket together.

\* \* \* \* \*